(12) United States Patent
Liaw et al.

(10) Patent No.: US 8,218,354 B2
(45) Date of Patent: Jul. 10, 2012

(54) SRAM WORD-LINE COUPLING NOISE RESTRICTION

(75) Inventors: Jhon Jhy Liaw, Hsin-Chu (TW); Hung-Jen Liao, Hsin-Chu (TW)

(73) Assignee: Taiwan Semicondcutor Manufacturing Co., Ltd., Hsin-Chu (TW)

( * ) Notice: Subject to any disclaimer, the term of this patent is extended or adjusted under 35 U.S.C. 154(b) by 259 days.

(21) Appl. No.: 12/649,806

(22) Filed: Dec. 30, 2009

(65) Prior Publication Data
US 2011/0157963 A1 Jun. 30, 2011

(51) Int. Cl.
*G11C 11/00* (2006.01)
(52) U.S. Cl. ............ 365/156; 365/206; 365/230.05
(58) Field of Classification Search .......... 365/154, 365/156, 230.05, 63, 205, 206
See application file for complete search history.

(56) References Cited

U.S. PATENT DOCUMENTS

| | | | |
|---|---|---|---|
| 6,347,062 B2* | 2/2002 | Nii et al. | 365/230.05 |
| 6,868,001 B2* | 3/2005 | Nii | 365/156 |
| 6,917,560 B2* | 7/2005 | Nii | 365/230.05 |
| 2001/0043487 A1* | 11/2001 | Nii et al. | 365/154 |
| 2005/0124095 A1 | 6/2005 | Liaw | |
| 2008/0084778 A1 | 4/2008 | Lin | |
| 2011/0157965 A1* | 6/2011 | Nii | 365/156 |

* cited by examiner

*Primary Examiner* — Gene Auduong
(74) *Attorney, Agent, or Firm* — Duane Morris LLP

(57) ABSTRACT

A DC mode word-line coupling noise restriction circuit for multiple-port Random Access Memory cells. This circuit may comprise a Static Random Access Memory array. The SRAM array contains a plurality of columns and a plurality of rows with an SRAM cell formed at a cross-point of the columns and rows. Each SRAM cell has a first word-line conductor and a second word-line conductor. The first word-line conductor is connected to a first coupling noise restriction circuit. The first coupling noise restriction circuit comprises an inverter and a NMOSFET. The inverter has another NMOSFET and a PMOSFET.

20 Claims, 8 Drawing Sheets

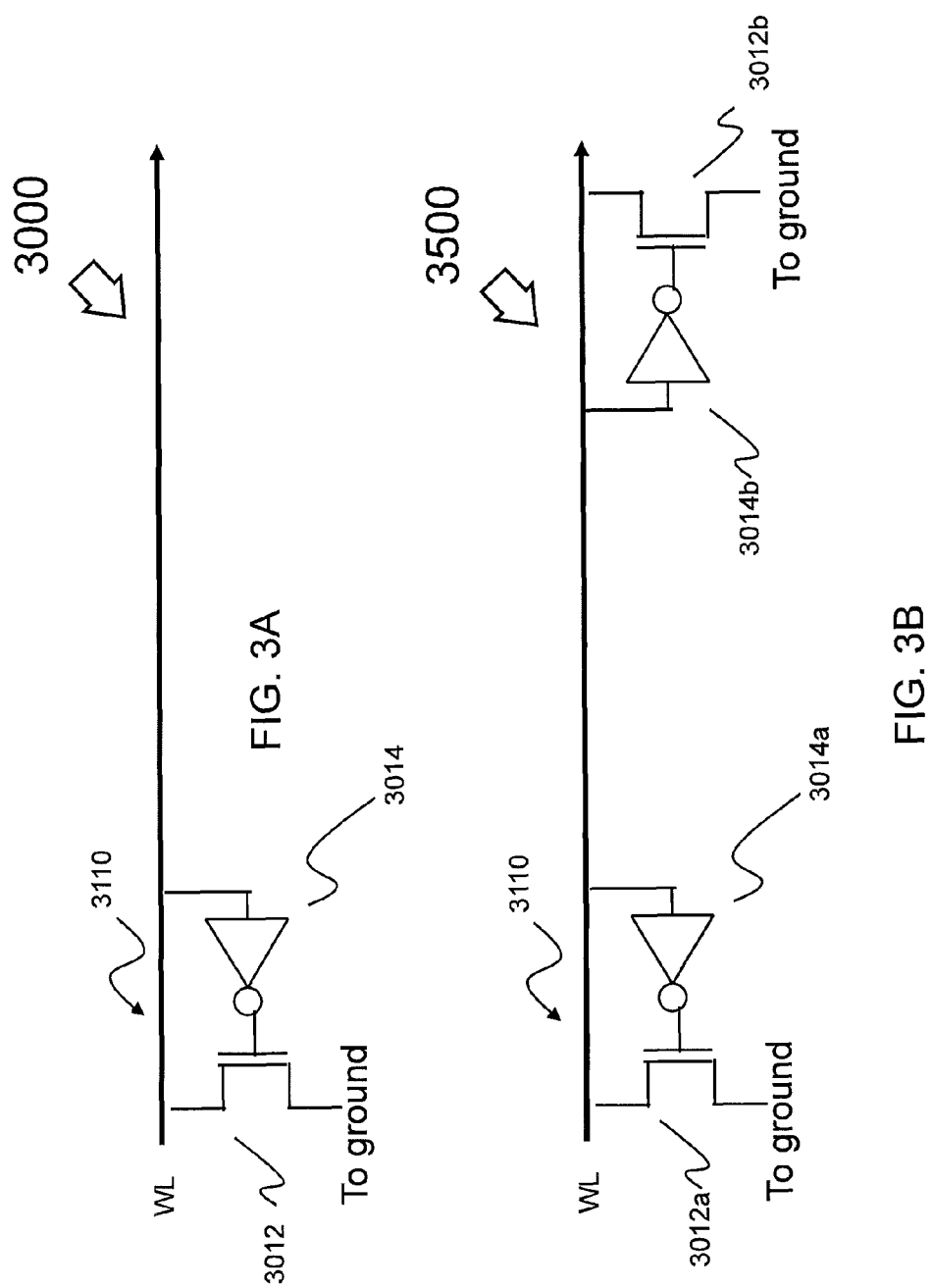

SRAM WORD-LINE COUPLING NOISE RESTRICTION

FIELD OF THE INVENTION

Aspects of the present invention relate to a electronic circuitry. More specifically, the embodiments relate to a direct current (DC) mode word-line coupling noise restriction circuit for multiple-port Random Access Memory (RAM) cells. Embodiments dramatically minimize the noise bounce between selected word-lines (WL) to adjacent non-selected word-lines.

BACKGROUND INFORMATION

Over time, semiconductors are fabricated in smaller-and-smaller sizes. Random Access Memory circuits often leading the forefront in the continuing shrinking-size race.

From 90 nanometers (nm) and beyond, the thin style memory cell structure has been became a key structure for high density embedded Static Random Access Memory (SRAM). As shown in FIG. 1, a SRAM chip 1000 has a dual-port (DP) unit cell array 1100 boarded by row-edge dummy cells 1200*a-b*, and two word lines 1300*a-b*. The unit cell array contains SRAM cells organized in rows-and-columns. In such cells, the length ratio of bit-line/word-line is less than 1/2 in single-port memory, or 1/3 in dual-port ("two-port") memory. These kind of cells have lower bit-line/word-line conductor length ratio in a unit cell for an index of lower bit-line loading effect for high speed application. On the other hand, these thin style cells also result in higher word line coupling capacitance due to longer word-line and narrow spacing. This induces worse word-line coupling noise between adjacent word-lines (like Dual-port's word-line-A to word-line-B, or adjacent bit's word-line).

To have smaller cell sizes, the cell height (in the bit-line routing direction) design is usually pushed to two gate-pitches dimension, and therefore allowed only 2 metal-word-lines routing in one cell. This means two adjacent word-lines have no additional metal line (such as Vss or Vdd) for noise shielding purposes. From cell stability point of view (word-line to word-line noise coupling), this worse word-line coupling noise will become a barrier to decreasing cell size.

SUMMARY

Embodiments include a DC mode word-line coupling noise restriction circuit for multiple-port Random Access Memory cells. This circuit may comprise a Static Random Access Memory array. The SRAM array contains a plurality of columns and a plurality of rows with an SRAM cell formed at a cross-point of the columns and rows. Each SRAM cell has a first word-line conductor and a second word-line conductor. The first word-line conductor is connected to a first coupling noise restriction circuit.

In some embodiments, the first coupling noise restriction circuit comprises an inverter and a NMOSFET. The inverter has another NMOSFET and a PMOSFET.

It is understood that the embodiments described within the summary are illustrative only, and that the invention is only restricted by the claims below.

BRIEF DESCRIPTION OF THE DRAWINGS

FIGS. 3A-3B illustrate single-sided and double-sided DC mode word-line coupling noise restriction circuits for multiple-port Random Access Memory cells.

DETAILED DESCRIPTION

Aspects of the present invention include a word-line noise restriction concept and circuitry to reduce and restrict DC mode word-line coupling noise in Static Random Access Memory chips. Aspects may dramatically minimize the noise bounce between selected WL to adjacent non-selected WL.

In another aspect, row-edge dummy cells in the SRAM array boundary, which are located adjacent the bit cells, are used to form a DC mode control circuit. The resulting embedded circuit are almost "cost-free" because of the mixed two functionalities (of dummy cells and word-line coupling noise reduction circuit) in one area. Internal power (such as CVdd and CVss) may be used to maintain the functionality. Note that in some embodiments, Vdd and CVdd are electrically connected while Vss and CVss are also electrically connected.

Embodiments will now be disclosed using Complementary Metal-Oxide-Semiconductor (CMOS) SRAM cells. It is understood by those known in the art that embodiments of the present invention may be implemented with any SRAM cells known in the art.

Figure 1:
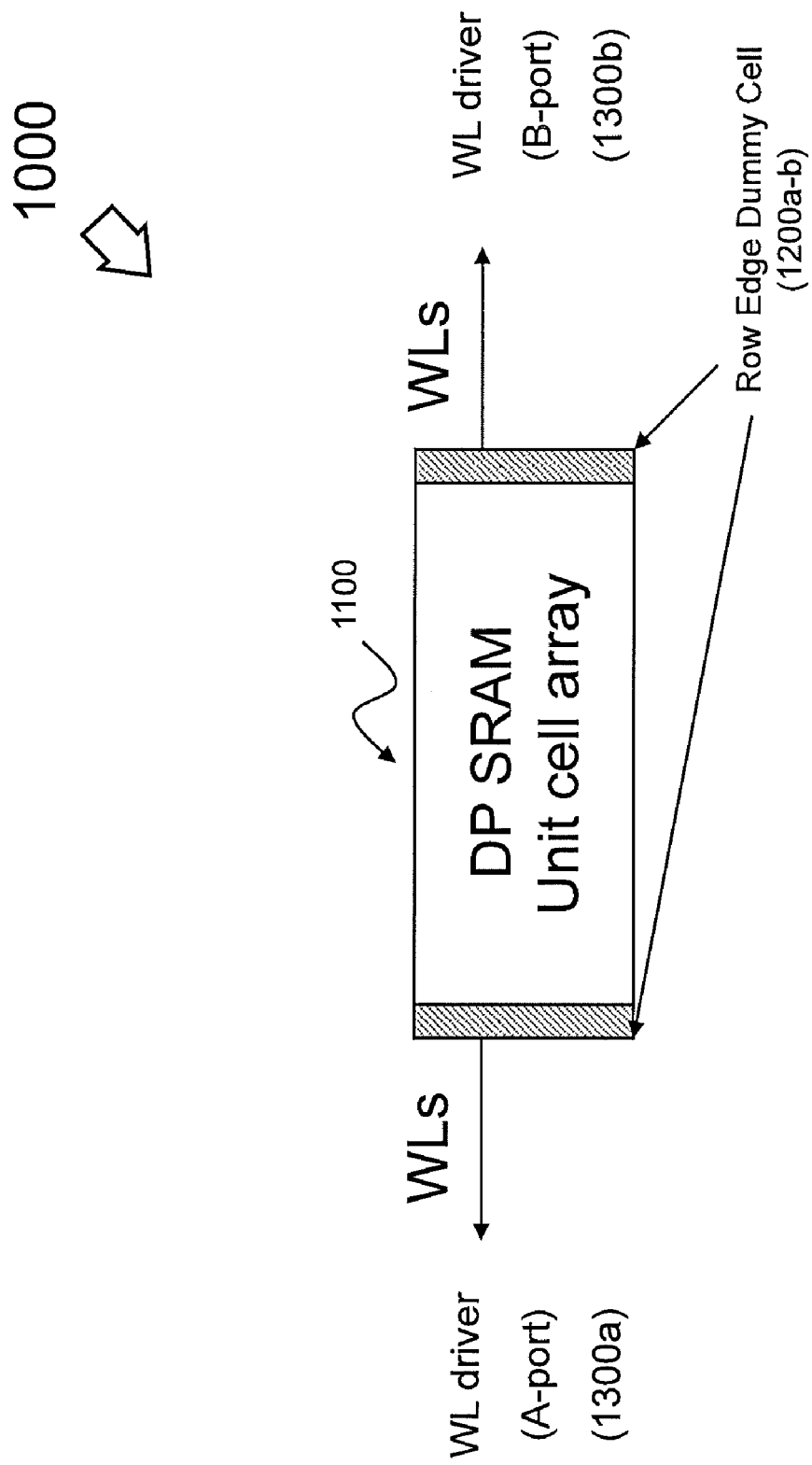
FIG. 1 is a dual-port Static Random Access Memory chip of the PRIOR ART.
Figure 2A:
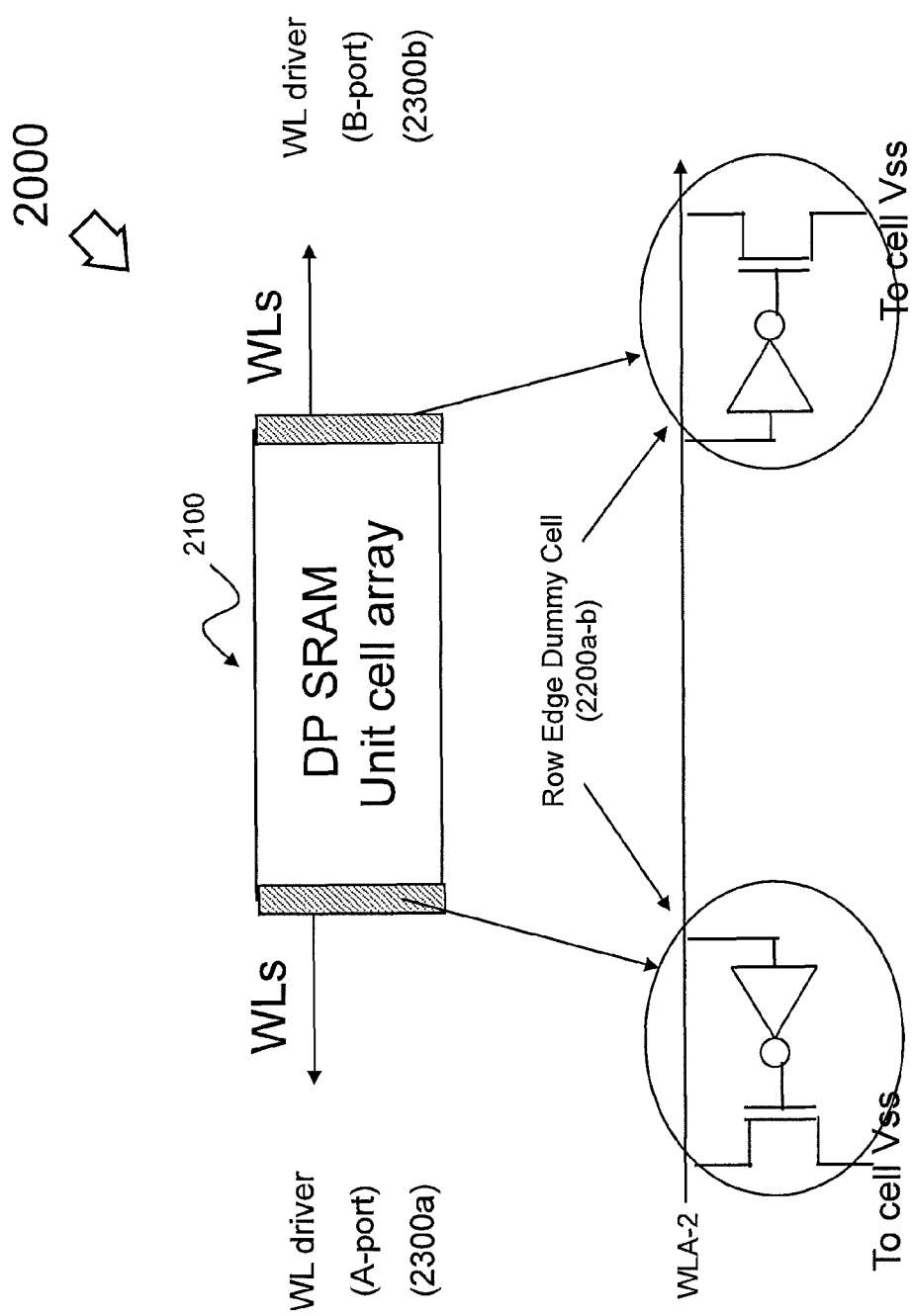
FIGS. 2A-2B depict a dual-port Static Random Access Memory chip including DC mode word-line coupling noise restriction circuits for multiple-port Random Access Memory cells.
Figure 2B:
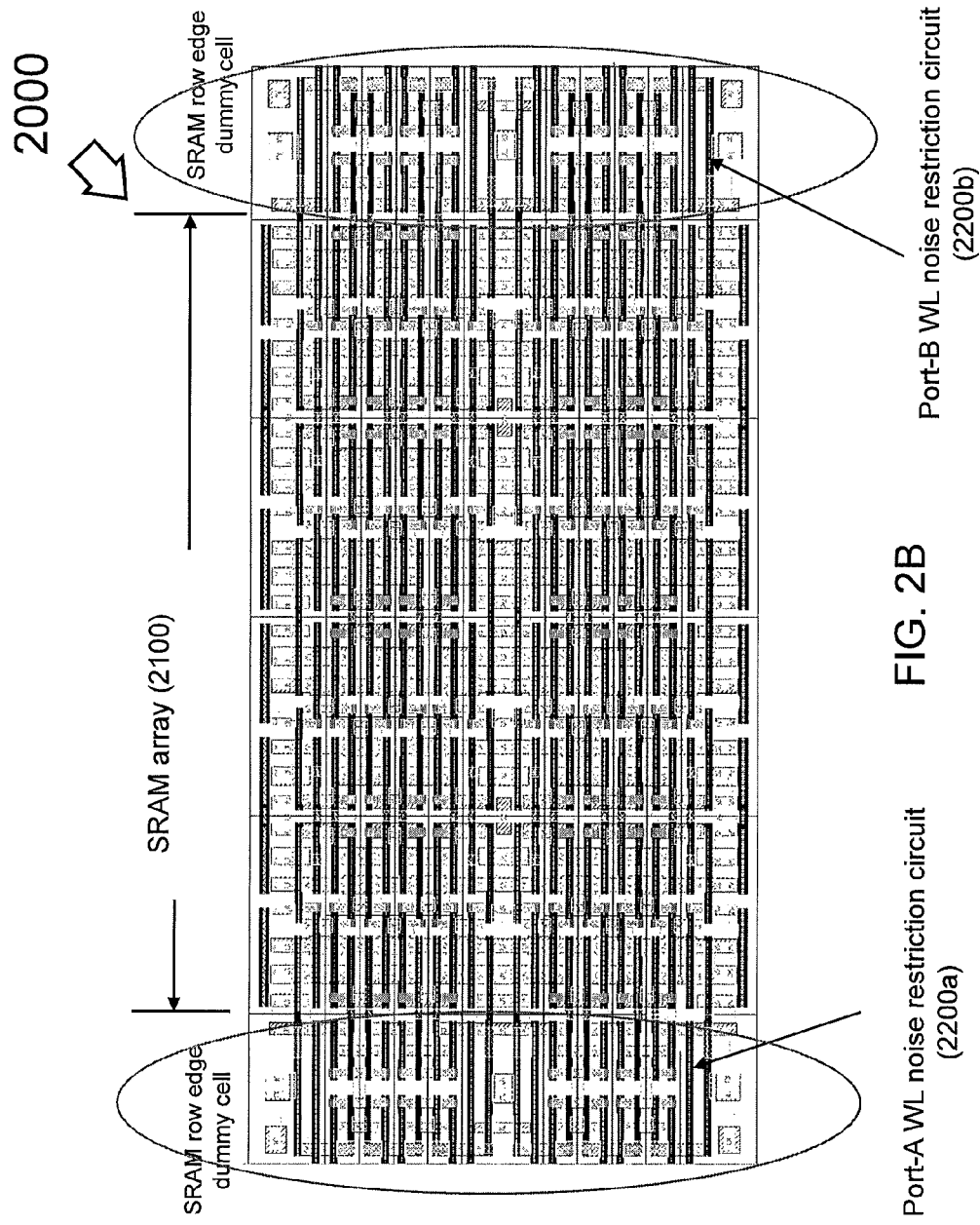

Turning to FIGS. 2A-2B, FIG. 2A illustrates a dual-port Static Random Access Memory chip 2000 including DC mode word-line coupling noise restriction circuits 2200*a-b* for a multiple-port Random Access Memory cells array 2100, while FIG. 2B depicts an example layout of such a SRAM chip, constructed in accordance with embodiments of the present invention. It is understood by those familiar with the art that the use of a dual-port SRAM embodiment is for illustrative purposes only, and the concepts applied herein may be equally applicable to single-port or multi-port SRAM arrays.

A Static Random Access Memory array 2100 contains a plurality of columns and a plurality of rows with an SRAM cell formed at a cross-point of the columns and rows. Each SRAM cell has a first word-line conductor and a second word-line conductor. The first word-line conductor is connected to a first coupling noise restriction circuit, 2200*a*. Noise restriction circuit 2200 is connected to a word-line 2300*a-b*.

In such an embodiment, the word-line coupling noise restriction circuitry 2200*a-b* is placed in what would otherwise be a row-edge dummy cell in the array boundary. Because of its placement in the array boundary (row-edge dummy cell), the word-line coupling noise restriction circuitry 2200 is almost cost-free. The mixed functionalities of dummy cell our circuit in one area uses internal power (CVdd and CVss).

The first coupling noise restriction circuit 2200*a* comprises an inverter and a NMOSFET. The inverter may comprise an NMOSFET and a PMOSFET. Similarly, the second coupling noise restriction circuit 2200*a* comprises an inverter and a NMOSFET; the inverter may also comprise an NMOSFET and a PMOSFET.

In these embodiments, when the word-line is not selected, the noise restriction circuit 2200 strongly ties the word-line to Vss.

Moving on, FIG. 3A illustrates a single-sided DC mode word-line coupling noise restriction circuit embodiment 3000 attached to a word-line 3110, in accordance with an embodiment of the present invention. Circuit 3000 is formed in the SRAM row edge dummy cell adjacent to a SRAM array (not shown).

Word-line coupling noise restriction circuit embodiment 3000 may be attached to a word-line 3110 for a Static Random Access Memory array (not shown). As discussed above, SRAM array contains a plurality of columns and a plurality of rows with an SRAM cell formed at a cross-point of the columns and rows. Each SRAM cell has a first word-line conductor 3110. The first word-line conductor is connected to a first coupling noise restriction circuit; this first coupling noise restriction circuit comprises an inverter 3014 and a NMOSFET 3012. The inverter 3014 may comprise another NMOSFET and a PMOSFET.

Moving on, FIG. 3B illustrates a double-sided DC mode word-line coupling noise restriction circuit embodiment 3500 attached to a word-line 3110, in accordance with an embodiment of the present invention. In this embodiment, word-line 3110 has two noise reduction circuits, one each end of the SRAM array (not shown). Circuit 3500 is formed in the SRAM row edge dummy cell adjacent to a SRAM array.

Again, SRAM array contains a plurality of columns and a plurality of rows with an SRAM cell formed at a cross-point of the columns and rows. Each SRAM cell has a first word-line conductor 3110. The first word-line conductor is connected to a coupling noise restriction circuit at each end row edge dummy cell adjacent to a SRAM array.

The first coupling noise restriction circuit comprises an inverter 3014*a* and a NMOSFET 3012*a*. The inverter 3014 may comprise another NMOSFET and a PMOSFET. Similarly, a second coupling noise restriction circuit comprises an inverter 3014*b* and a NMOSFET 3012*b*. The inverter 3014*a* may comprise yet another NMOSFET and a PMOSFET.

Figure 4A:
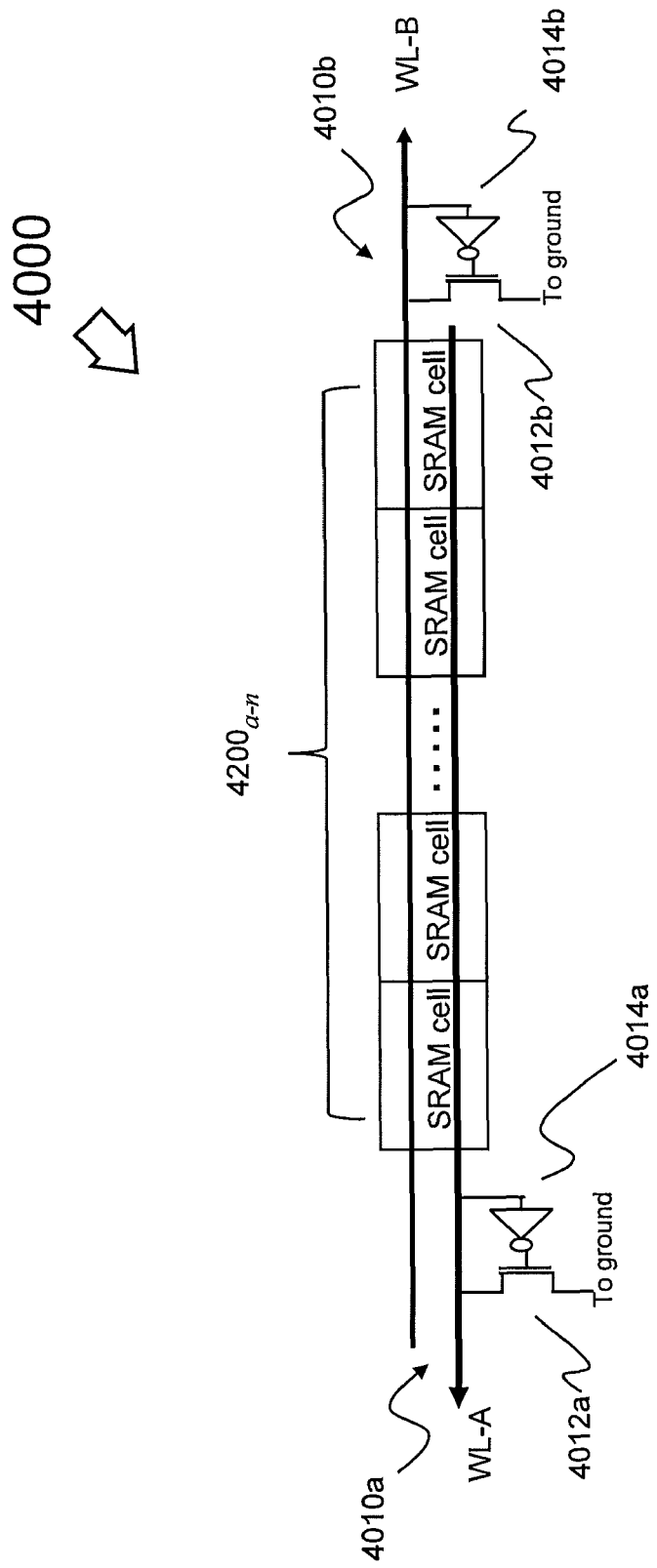
FIGS. 4A-4B demonstrate single-sided and double-sided dual-port DC mode word-line coupling noise restriction circuits for multiple-port Random Access Memory cells.
Figure 4B:
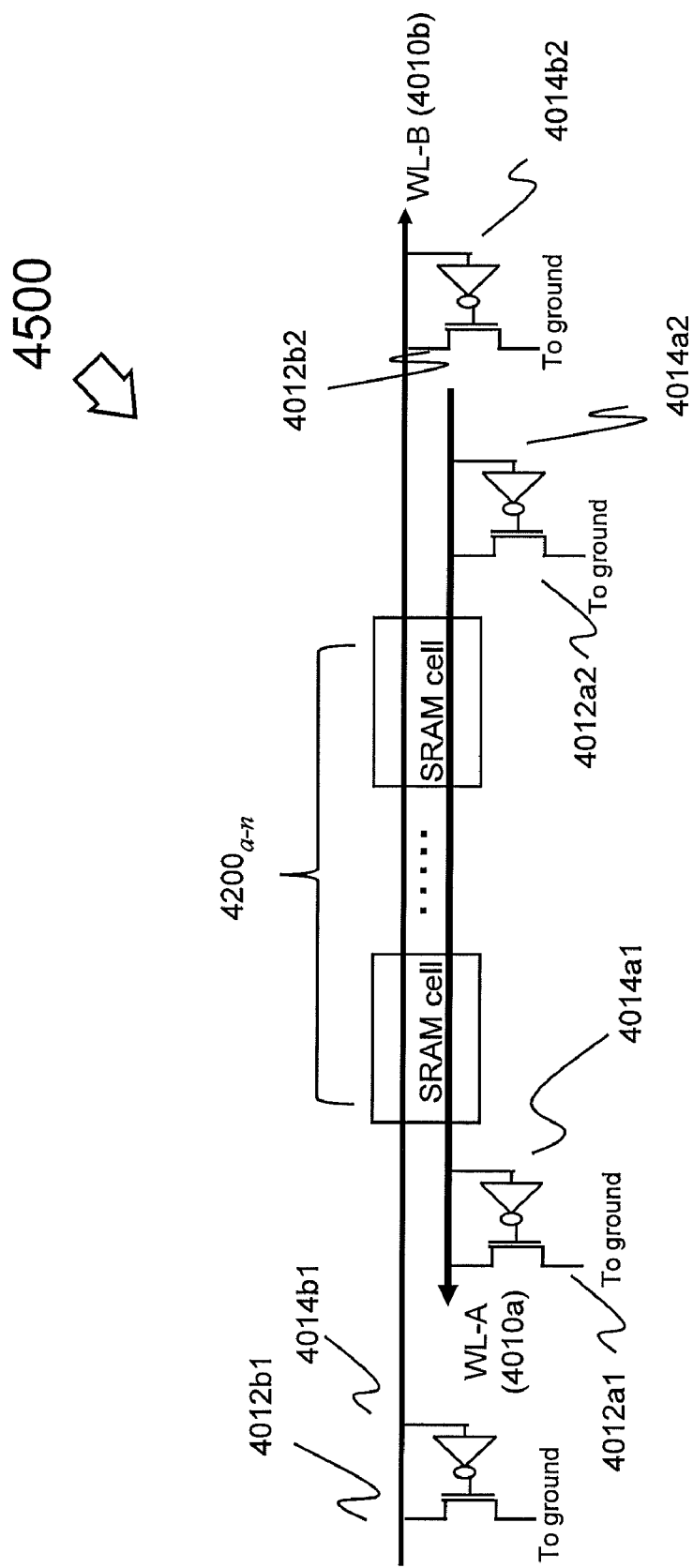

FIGS. 4A-4B demonstrate dual-port DC mode word-line coupling noise restriction embodiments for multiple-port Random Access Memory cells, in accordance with embodiments of the present invention. FIG. 4A illustrates a single-sided dual-port embodiment 4000, while FIG. 4B illustrates the double-sided dual-port embodiment 4500.

In single-sided dual-port embodiment 4000, shown in FIG. 4A, each SRAM row of the SRAM array comprises a plurality of SRAM cells 4200*a-n*, and two word-lines 4010*a-b*. In this embodiment, each word-line 4110 has one noise reduction circuit, located at an end of the SRAM array. The noise reduction circuit is formed in the SRAM row edge dummy cell adjacent to a SRAM array.

The coupling noise restriction circuit comprises an inverter 4014*a*/4014*b* and a NMOSFET 4012*a*/4012*b*. The inverter 4014*a*/4014*b* may comprise another NMOSFET and a PMOSFET.

Moving on to FIG. 4B, the double-sided dual-port embodiment 4500, is shown. Similarly, each SRAM row of the SRAM array comprises a plurality of SRAM cells 4200*a-n*, and two word-lines 4010*a-b*. However, in this embodiment, each word-line 4110 has two noise reduction circuits, located at each end of the SRAM array. The noise reduction circuits are formed in the SRAM row edge dummy cell adjacent to a SRAM array.

The coupling noise restriction circuits comprise an inverter 4014*a*1/4014*a*2/4014*b*1/4014*b*2 and a NMOSFET 4012*a*1/4012*a*2/4012*b*1/4012*b*2. The inverter 4014*a*1/4014*a*2/4014*b*1/4014*b*2 may comprise another NMOSFET and a PMOSFET.

Figure 5A:
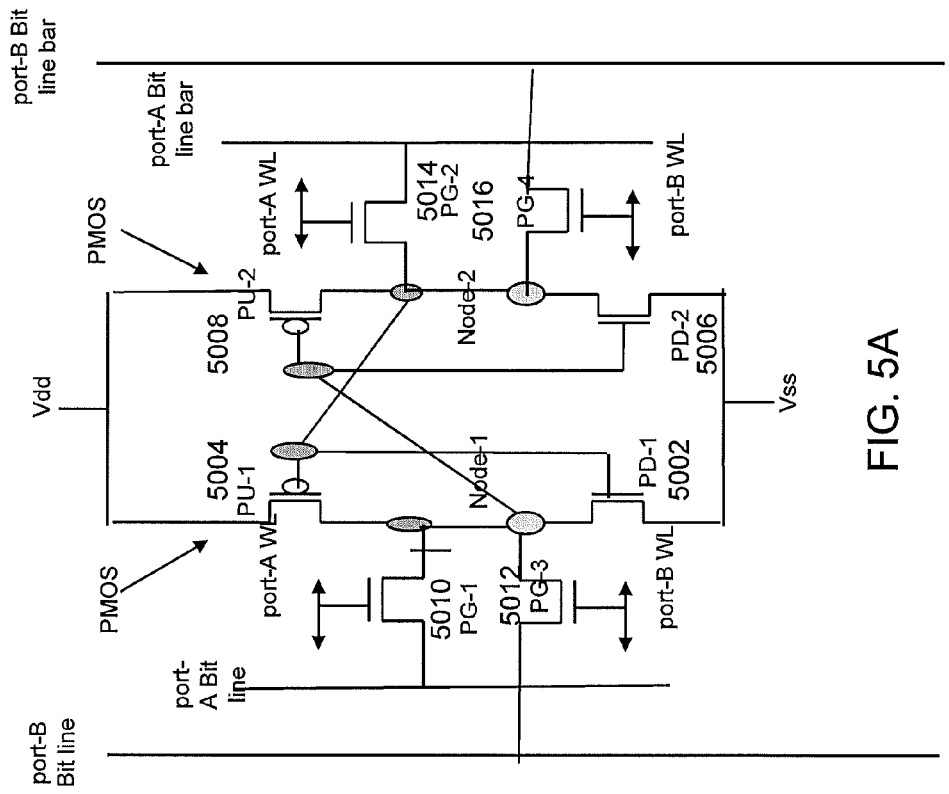
FIGS. 5A-B is a schematic of an embodiment of a dual port/two-port cell.
Figure 5B:
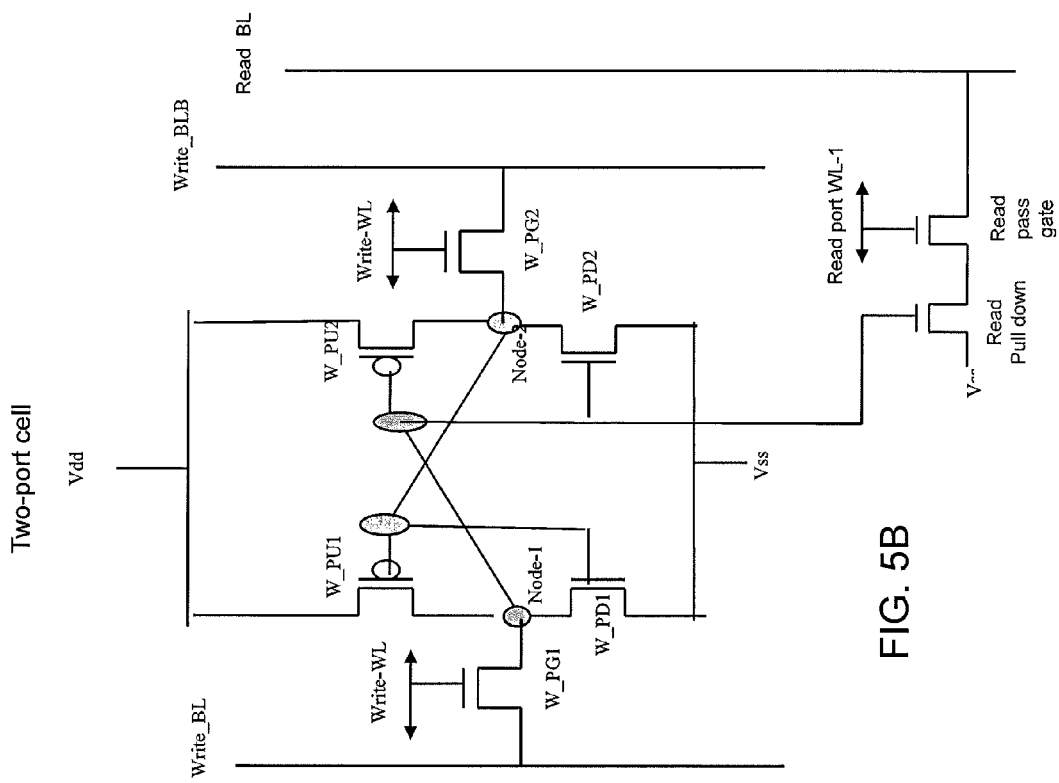

FIG. 5A is a schematic of an embodiment of a dual port cell, while FIG. 5B is a schematic of an embodiment of a two-port cell, in accordance with an embodiment of the present invention. These embodiments are depicted from the point-of-view of a SRAM cell 4500.

In FIGS. 5A-B, the drain nodes of the first NMOSFET 5002 and the first PMOSFET 5004 are electrically connected. The gate nodes of the first NMOSFET 5002 and the first PMOSFET 5004 are electrically connected together and electrically connected to a predetermined word-line. The source node of the first PMOSFET 5004 is electrically connected to a first supply voltage (Vdd). The source node of the first NMOSFET 5002 is electrically connected to a second supply voltage (Vss). The drain node of second NMOSFET 5006 is electrically connected to the predetermined word-line. The gate node of second NMOSFET 5006 is electrically connected to the drain nodes of the first NMOSFET 5002 and the first PMOSFET 5004, and the source node of the second NMOSFET 5006 is electrically connected to Vss.

A connection path between the gate nodes of the first NMOSFET 5002 and the first PMOSFET 5002 to a predetermined word-line is through a gate layer. Furthermore, a connection path between the drain node of the second NMOSFET 5006 to a predetermined word-line is through a metal layer (M1).

In some embodiments, a length ratio of the word-line to a bit-line is larger than 3.5 in one unit cell.

In the foregoing specification, the aspects have been described with reference to specific embodiments thereof. It will, however, be evident that various modifications and changes may be made thereunto without departing from the broader spirit and scope as set forth in the appended claims. The specification and drawings are accordingly to be regarded in an illustrative rather than in a restrictive sense.

What is claimed is:

1. A circuit, comprising:
    at least one Static Random Access Memory (SRAM) array, the SRAM array containing a plurality of columns and a plurality of rows with an SRAM cell formed at a cross-point of the columns and rows;
    wherein each SRAM cell has a first word-line conductor and a second word-line conductor;
    wherein the first word-line conductor is connected to a first coupling noise restriction circuit.

2. The circuit of claim 1, wherein the first coupling noise restriction circuit comprises:
    a first inverter with a first n-type Metal-Oxide-Semiconductor Field-Effect Transistor (NMOSFET) and a first p-type Metal-Oxide-Semiconductor Field-Effect Transistor (PMOSFET); and
    a second NMOSFET.

3. The circuit of claim 2, each of said Metal-Oxide-Semiconductor Field-Effect Transistors (MOSFETs) have a drain node, source node and gate node, wherein:
    the drain nodes of the first NMOSFET and the first PMOSFET are electrically connected;
    the gate nodes of the first NMOSFET and the first PMOSFET are electrically connected together and electrically connected to a predetermined word-line;
    the source node of the first PMOSFET is electrically connected to a first supply voltage (Vdd);

the source node of the first NMOSFET is electrically connected to a second supply voltage (Vss);

the drain node of second NMOSFET is electrically connected to the predetermined word-line;

the gate node of second NMOSFET is electrically connected to the drain nodes of the first NMOSFET and the first PMOSFET; and the source node of the second NMOSFET is electrically connected to Vss.

4. The circuit of claim 3, wherein a connection path between the gate nodes of the first NMOSFET and the first PMOSFET to said predetermined word-line is through a gate layer.

5. The circuit of claim 3, wherein a connection path between the drain node of the second NMOSFET to said predetermined word-line is through a metal layer (M1).

6. The circuit of claim 3, wherein the SRAM each cell comprises:
- at least two ports, each said port comprises word-line conductors and bit-line conductors to serve read or write functionality;
- a CVdd conductor line and CVss conductor lines configured to route power; and
- wherein a length ratio of said word-line to bit-line is larger than 3.5 in one unit cell.

7. The circuit of claim 6, said Vdd and CVdd are electrically connected.

8. The circuit of claim 6, said Vss and CVss are electrically connected.

9. The circuit of claim 1, said SRAM cell is a dual port SRAM cell, two-port SRAM cell, or multiple SRAM cell.

10. The circuit of claim 2,
wherein said word-line is connected to the first coupling noise restriction circuit, the first coupling noise restriction circuit located on a word-line first line end.

11. The circuit of claim 10, further comprising:
a second coupling noise restriction circuit located on a second line end of the word-line.

12. The circuit of claim 11, wherein the second coupling noise restriction circuit comprises:
- a second inverter with a third NMOSFET and a third PMOSFET; and
- a fourth NMOSFET.

13. The circuit of claim 11, each of said MOSFETs have a drain node, source node and gate node, wherein:
- the drain nodes of the first NMOSFET and the first PMOSFET are electrically connected;
- the gate nodes of the first NMOSFET and the first PMOSFET are electrically connected together and electrically connected to a predetermined word-line;
- the source node of the first PMOSFET is electrically connected to a first supply voltage (Vdd);
- the source node of the first NMOSFET is electrically connected to a second supply voltage (Vss);
- the drain node of second NMOSFET is electrically connected to the predetermined word-line;
- the gate node of second NMOSFET is electrically connected to the drain nodes of the first NMOSFET and the first PMOSFET; and
- the source node of the second NMOSFET is electrically connected to Vss.

14. The circuit of claim 13, wherein the SRAM each cell comprises:
- at least two ports, each said port comprises word-line conductors and bit-line conductors to serve read or write functionality;
- a CVdd conductor line and CVss conductor lines configured to route power; and
- wherein said Vdd and CVdd are electrically connected.

15. The circuit of claim 14, wherein said Vss and CVss are electrically connected.

16. A dual-port Static Random Access Memory (SRAM) array comprising:
a plurality of SRAM cells organized into a plurality of columns and a plurality of rows, each cross-point of the columns and the rows containing one said SRAM cell;
each SRAM cell further comprises:
at least two ports, port-A and port-B, wherein port-A comprises a first word-line conductor and a first bit-line conductor configured to serve as read or write functionality, and wherein port-B comprises a second word-line conductor and a second bit-line conductor configured to serve as read or write functionality;
two cross-coupled inverters having a data storage node and a data bar storage node, each of said cross-coupled inverters having one n-type Metal-Oxide-Semiconductor (NMOS) device and one p-type Metal-Oxide-Semiconductor (PMOS) device;
three layers of metal routing, including a first layer, a second layer, and a third layer, wherein the first metal layer is configured to interconnect the SRAM cell, the second metal layer is configured to serve said CVdd line and said CVss lines, the third metal layer is configured to serve said first word-line and said second word-line; and
each of said first and said second word-line is connected to a coupling noise restriction circuit.

17. The array of claim 16, each said coupling noise restriction circuit comprises:
a third inverter with a third NMOSFET and a third PMOSFET; and
a fourth NMOSFET.

18. A Static Random Access Memory (SRAM) array comprising:
a plurality of SRAM cells organized into a plurality of columns and a plurality of rows, each cross-point of the columns and the rows containing one said SRAM cell;
each SRAM cell further comprises:
four pass-gate devices configured as read/write functionality control;
two cross-coupled inverters having a data storage node and a data bar storage node, each of said cross-coupled inverters having one n-type Metal-Oxide-Semiconductor (NMOS) device and one p-type Metal-Oxide-Semiconductor (PMOS) device;
four bit-lines;
two word-lines; and
wherein the length ratio of at least one said word-line to at least one said bit-line is larger than 3.5 in one unit cell.

19. A Static Random Access Memory (SRAM) array comprising:
a plurality of SRAM cells organized into a plurality of columns and a plurality of rows, each cross-point of the columns and the rows containing one said SRAM cell;
each SRAM cell further comprises:
three pass-gate devices configured as read/write functionality control;
two cross-coupled inverters having a data storage node and a data bar storage node, each of said cross-coupled inverters having a first n-type Metal-Oxide-Semiconductor Field Effect Transistor (NMOSFET) device and a first p-type Metal-Oxide-Semiconductor Field Effect Transistor (PMOSFET) device;
at least three bit-lines;

at least two word-lines;
wherein the length ratio of at least one said word-line to at least one said bit-line is larger than 3.5 in one unit cell.

20. The array claim 19,
wherein each said MOSFETs comprises a drain node, a source node and a gate node,
wherein:
the drain nodes of the first NMOSFET and the first PMOSFET are electrically connected;
the gate nodes of the first NMOSFET and the first PMOSFET are electrically connected together and electrically connected to a predetermined word-line;
the source node of the first PMOSFET is electrically connected to a first supply voltage (Vdd);
the source node of the first NMOSFET is electrically connected to a second supply voltage (Vss);
the drain node of second NMOSFET is electrically connected to the predetermined word-line;
the gate node of second NMOSFET is electrically connected to the drain nodes of the first NMOSFET and the first PMOSFET; and
the source node of the second NMOSFET is electrically connected to Vss.

* * * * *